United States Patent [19]

Yoshida et al.

[11] 4,181,542

[45] Jan. 1, 1980

[54] METHOD OF MANUFACTURING JUNCTION FIELD EFFECT TRANSISTORS

[75] Inventors: Takashi Yoshida; Takeshi Matsuyama; Tamaki Kuki; Takayuki Kodaka, all of Hamamatsushi, Japan

[73] Assignee: Nippon Gakki Seizo Kabushiki Kaisha, Hamamatsu, Japan

[21] Appl. No.: 845,202

[22] Filed: Oct. 25, 1977

[30] Foreign Application Priority Data

Oct. 25, 1976 [JP] Japan .............................. 51-128048
Nov. 9, 1976 [JP] Japan .............................. 51-134567

[51] Int. Cl.² ...................................... H01L 21/225
[52] U.S. Cl. .................................. 148/187; 29/571; 148/175; 148/188; 148/190; 357/22
[58] Field of Search ................. 357/22; 148/187, 188, 148/190, 175; 29/571

[56] References Cited

U.S. PATENT DOCUMENTS

| | | | |
|---|---|---|---|
| 3,472,710 | 10/1969 | Welty | 148/175 |
| 4,030,954 | 6/1977 | Horie | 148/187 X |
| 4,049,476 | 9/1977 | Horie | 148/175 |

*Primary Examiner*—G. Ozaki
*Attorney, Agent, or Firm*—Koda and Androlia

[57] ABSTRACT

A vertical or horizontal type junction FET including a channel-gate structure formed by a double diffusion process in which two treatments for diffusing different impurities are executed through an identical opening provided in a diffusion mask. For fabricating a vertical type junction FET, such double diffusion process is applied to stacked upper and lower semi-conductor layers having opposite conducting types thereby forming a channel region adjacent to the upper semi-conductor layer which functions as a first gate region and forming a second gate region adjacent to the channel region and remote from the first gate region. For fabricating horizontal type junction FET, the double diffusion process stated above is applied to a single semi-conductor layer to form a first gate region thereby forming a channel region adjacent to the first gate region and a second gate region adjacent to the channel region and remote from the first gate region. In either type of junction FET's the width of each channel region is precisely determined and corresponds to the difference in the diffusion depths in the two diffusion treatments. Moreover, the impurity concentration and the concentration profile of each channel region is determined independently of those of the drain or source region. Furthermore in the manufacturing process of each FET, the second gate region is self aligned so as to overlap a corresponding channel region.

5 Claims, 13 Drawing Figures

METHOD OF MANUFACTURING JUNCTION FIELD EFFECT TRANSISTORS

BACKGROUND OF THE INVENTION

1. Field of Invention

This invention relates to vertical or horizontal type junction field effect transistors and methods for manufacturing same and more particularly to field effect transistors wherein the channel-gate structure is formed by a diffusion technique.

2. Prior Art

In general, junction field effect transistors (hereinafter referred to as FET) are broadly classified into horizontal and vertical types. Conventionally, the horizontal type junction FET is fabricated by a method in which on the surface of a semi-conductor substrate of a first conductivity type a semi-conductor layer of a second conductivity type which is opposite to the first conductivity type is formed by epitaxial growth or a diffusion technique. By such a method in the surface of the semi-conductor substrate layer of the first conductivity type a gate region is formed by diffusion so as to combine a channel region of a second conductivity type betwen the first conductivity type gate region and the first conductivity portion of the substrate. On the other hand, a vertical type junction FET is fabricated by forming on the surface of a semi-conductor substrate of a first conductivity type which is the drain region a gate region of a second conductivity type opposite to the first conductivity type by diffusion in a predetermined shape such as a mesh and stripe and growing a source region of a first conductivity type by epitaxial method covering the gate region so that the gate region is buried in the structure.

In the conventional FET's since the area of the gate P-N junction is comparatively large, the gate-source capacitance is large so that the high frequency characteristics of the FET are impaired. Furthermore, since the width and length of the channel are determined substantially by a gate diffusion pattern, it is difficult to attain a minute channel structure of a high purity concentration having a high gain and it is also difficult to effectively utilize the chip area with such a minute structure.

In addition, the above described conventional method of manufacturing horizontal type or vertical type junction FET has the additional problems described below. To enhance the power utilization efficiency, it is desirable to make the saturation voltage or on resistance low. However, when the impurity concentration of the channel is increased in order to lower this voltage or resistance, a depletion layer becomes difficult to spread. On the other hand, the pinch-off voltage or cut-off voltage increases and the drain breakdown voltage lowers. These contradictory results in the characteristics are attributed to the fact that in the prior art method the channel region is prepared in the same manufacturing step with the source or drain region so that the channel region has the same impurity concentration as the source or drain. It has therefore been considered as a solution to form the channel region and the source or drain region in separate steps. By merely providing such individual steps, however, the number of steps increases and the yield of the product decreases, which is undesirable from the view point of cost production.

SUMMARY OF THE INVENTION

Accordingly it is the general object of the present invention to provide a junction FET which is equipped with a minute channel-gate structure suitable for mass production with a good yield and which exhibits a high gain as well as good high frequency characteristics.

It is another object of the present invention to provide a junction FET which has a small "on" resistance, low pinch-off voltage and high drain break-down voltage.

It is still another object of the present invention to provide a method of manufacturing a junction FET having a minute channel-gate structure with a high yield and a small number of manufacturing steps.

It is yet another object of the present invention to provide a method of manufacturing a junction FET which minimizes the number of times diffusion mask alignment steps are required for individually forming a channel region and a source or drain region.

In keeping with the principles of the present invention, the objects are accomplished by a unique vertical or horizontal type junction FET comprising a channel-gate structure formed by a double diffusion process in which two diffusing steps for different impurities are executed through an identical opening in a diffusion mask. For a vertical type junction FET, the double diffusion process is applied to stacked upper and lower semi-conductor layers having opposite conductivity types thereby forming a channel region adjacent to the upper semi-conductor region which functions as a first gate region and forming a second gate region adjacent to the channel region and remote from the first gate region. For a horizontal type junction FET, the double diffusion process is applied to a single semi-conductor layer to form a first gate region thereby forming a channel region adjacent to the first gate region and forming a second gate region adjacent to the channel region and remote from the first gate region. In either type of junction FET, the width of each channel region is precisely determined and is the difference of the diffusion depths in the two diffusion treatments. Moreover, the impurity concentration and the concentration profile of each channel region is determined independently of those of the drain region.

BRIEF DESCRIPTION OF THE DRAWINGS

The above mentioned other features and objects of the present invention will become more apparent by reference to the following description taken in conjunction with the accompanying drawings, wherein like reference numerals denote elements and in which:

FIG. 5 is a sectional view illustrating a modified embodiment of the gate structure for an FET made in accordance with the teachings of the present invention;

DETAILED DESCRIPTION OF THE INVENTION

Figure 1:
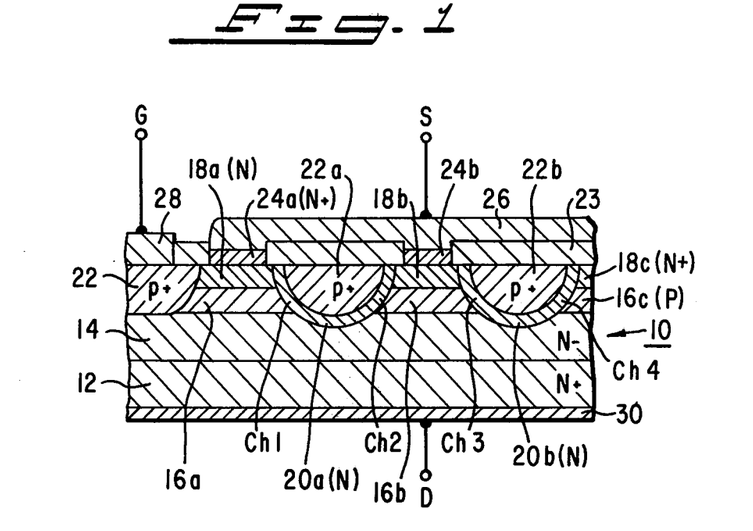
FIG. 1 is a sectional view illustrating a vertical type junction FET in accordance with the teachings of the present invention.

Referring more particularly to the figures, shown in FIG. 1 is a vertical type junction FET made in accordance with the teachings of the present invention. In FIG. 1, the vertical type junction FET comprises a semi-conductor substrate 10 made of, for example, silicon. The substrate 10 includes an $N^+$-type semi-conductor layer 12, an $N^-$-type semi-conductor layer 14 overlying the layer 12, P-type semi-conductor layers 16a, 16b and 16c on the layer 14, and $N^+$-type semi-conductor layers 18a, 18b and 18c on the respective layers 16a through 16c. The N-type semi-conductor layers 12 and 14 function as a drain region. The $N^+$-type layer 12 can be formed by doping one surface of the $N^-$-type semi-conductor layer 14 with a donor impurity at a high concentration. The $N^+$-type serves to provide a good ohmic contact with the drain electrode layer 30. The P-type semi-conductor layers 16a through 16c functioning as gate regions can be formed by epitaxially growing silicon on the semi-conductor layer 14 while the $N^+$-type layers for sources 18a through 18c are formed by doping the epitaxially grown layer with a donor impurity at a comparatively high concentration. Alternately, these $N^+$-type layers 18a through 18c may be formed simultaneously with the formation of the polycrystalline layers 24a and 24b doped with $N^+$-type impurity by rendering this impurity diffused into the P-type layers 16a through 16c.

In the surface of the substrate 10 which includes the stacked semi-conductor layers described above, N-type semi-conductor regions for channels 20a and 20b are formed to reach the $N^-$-type layer 14 by, for example, a diffusion technique in either a plan pattern which is described in detail later with reference to FIGS. 2 to 4. Furthermore, $P^+$-type semi-conductor regions for gates 22a and 22b are formed in a manner to partially lie within the N-type regions 20a and 20b respectively. The $P^+$-type regions 22a and 22b can be formed by the diffusion of an acceptor impurity simultaneously with the formation of a $P^+$-type region 22 in order that they may be continuous to the $P^+$-type region 22. In this case, in order to precisely register the $P^+$-type regions 22a and 22b to the $N^+$-type regions 20a and 20b, diffusion of the $P^+$-type regions 22a and 22b is carried out preferably through the same diffusion window that is used for the diffusion of the N-type regions 20a and 20b.

Figure 2:
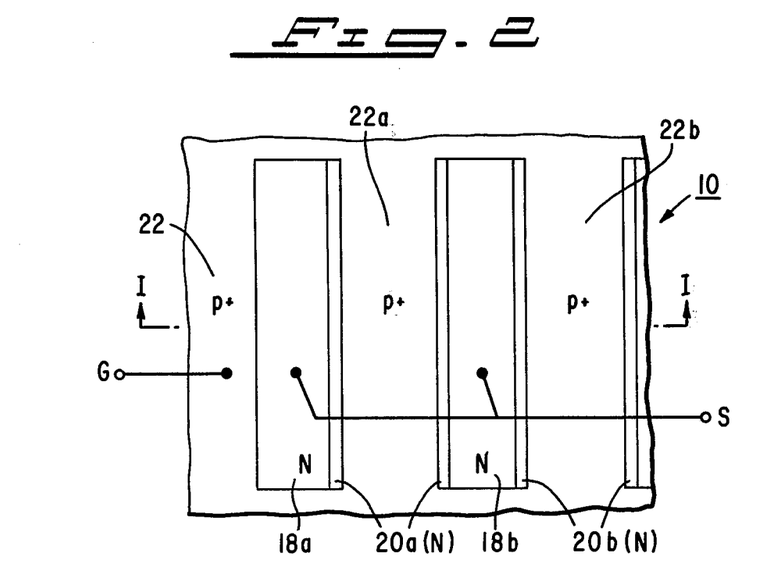
FIGS. 2, 3, and 4 are plan views illustrating different gate patterns for FET's made in accordance with the teachings of the present invention.

Referring to FIG. 2, shown therein is the gate pattern on the surface of the substrate 10 and a section along the lines I—I in FIG. 2 corrsponds to that shown in FIG. 1. As is shown in FIGS. 1 and 2, the N-type regions for the channels 20a and 20b which are comparatively deep so as to reach the $N^-$-type semi-conductor layer 14 are formed in the shape of stripes. The $P^+$-type regions 22a and 22b which are relatively shallow are formed also in the shape of stripes and correspond with the respective regions 20a and 20b and the regions 22a and 22b are integral with the $P^+$-type region 22 which is formed at a depth just crossing the $P^+$-type semi-conductor layer in a manner to join therewith.

Deposited on the surface of the $P^+$-type region 22 is a gate electrode layer 28 to which a gate terminal G is connected. Low-resistivity polycrystalline silicon layers 24a and 24b which are doped with $N^+$-type impurity are held in ohmic contact with the corresponding $N^+$-type source regions 18a and 18b respectively. Silicon layers for contacts 24a and 24b are connected with each other by a source electrode layer 26 which is made from metal and which extends on the insulating film 23 formed of silicon oxide covering the substrate surface except for the contact portions. Source terminal S and drain terminal D are coupled to the source and drain electrode layers 26 and 30 respectively.

In the vertical type junction FET described above, channels Ch1 and Ch2 are defined between the $P^+$-type region 22a and the respective P-type layer 16a and 16b while the channels Ch3 and Ch4 are defined between the $P^+$-type region 22b and the respective P-type layers 16b and 16c. Each of the channels has its width set substantially by the distance between the two opposing gate P-N junctions and has its length set substantially by the thickness of the P-type layers 16a through 16c. For the sake of comparison, suppose a prior-art vertical type junction FET which has buried strip gate regions identical in size to the gate regions 22a and 22b. Then, such a FET will have buried gate regions in which the semicircular section of the $P^+$-type regions 22a and 22b is a circular one and will have a channel region established between the regions 22a and 22b. Thus, such a FET will have a gate and channel structure which is much larger in size than the gate and channel structure of the FET made in accordance with the teachings of the present invention as illustrated in FIGS. 1 and 2. Furthermore, the channels Ch1 through Ch4 made in accordance with the present invention are very small channels which are arranged such that one lies on each side of the gate regions 22a and 22b. Since the vertical type junction FET according to the present invention has a unique gate and channel structure as shown and has a small gate junction area, it has a small gate-source capacitance and exhibits excellent high frequency characteristics. On the other hand, since the narrow and short channels which extend in the thickness direction of the P-type layer 16a through 16c exhibit good carrier current controllability, high gain is demonstratable. Furthermore, since such minute channels are adapted to be included in large numbers within a single chip, the utilization factor for the chip is enhanced.

Figure 3:
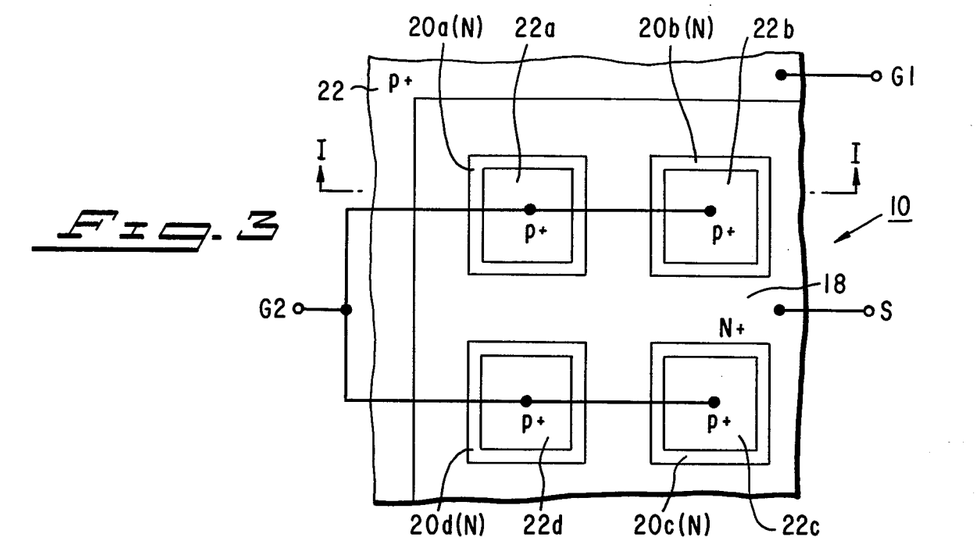

Referring to FIG. 3, shown therein is a modified embodiment of the gate pattern and FIG. 1 corresponds to a section taken along the lines I—I. In FIG. 3, those elements which are the same as shown in FIG. 1 are given like reference numerals and a description of their inter-connection operation will be omitted.

In FIG. 3, the gate structure for the $P^+$-type regions for gates 22 and 22a through 22d are isolated from each other. A first gate terminal G1 and a second gate terminal G2 are respectively provided. The N-type channel region 20a through 20d are arranged between a mesh $N^+$-type source region 18 and the respective $P^+$-type gate regions 22a through 22d. When the two gate terminals are provided as described in FIG. 3, the aspects of use of the vertical type junction FET are enriched.

Figure 4:
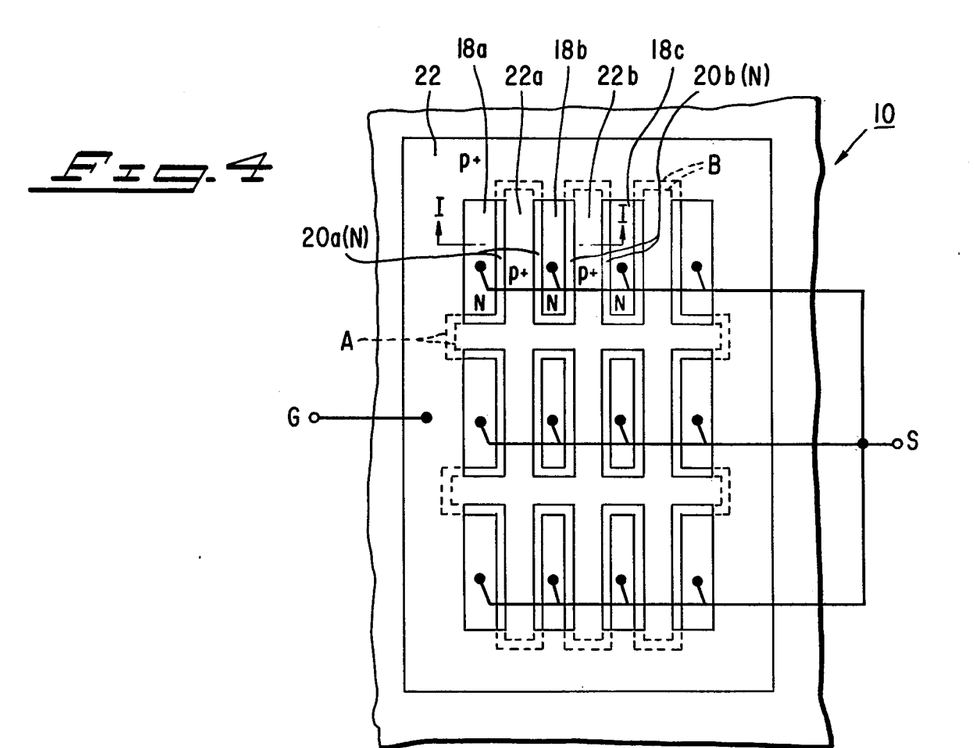

Referring to FIG. 4, shown therein is still another modification of the gate pattern and FIG. 1 corresponds to a section taken along the lines I—I. In FIG. 4, those elements which are the same as those in FIG. 1 are given like reference numerals and a description of their interconnection in operation are omitted. In FIG. 4, the P+-type gate regions 22, 22a and 22b are formed continuously and in a mesh shape. In fabricating this structure a donor impurity is first diffused into selected areas through a lattice diffusion window so as to form N-type channel regions 20a and 20b. Upon the N-type channel regions an acceptor impurity is diffused into selected areas through the same diffusion window. The acceptor impurity is diffused relatively shallowly so as to form the P+-type regions 22a and 22b. Thereafter, the P+-type region 22 is formed by selective diffusion so that it overlaps the N-type regions 22a and 22b and the P+-type regions 22a and 22b at the points indicated by A and B. The N-type regions at the portions A and B are inverted into P-conductivity type because the impurity concentration of the P+-type region 22 is relatively high. Finally, the mesh gate pattern shown is obtained. A gate terminal G and a source terminal S are conductively coupled by any known method to the P+-type region 22 and to a large number of source regions 18a, 18b, 18c, etc. located at portions corresponding to the mesh, respectively.

Referring to FIG. 5, shown therein is a modified embodiment of the gate structure illustrated in FIG. 1. In FIG. 5 like elements to those of FIG. 1 are given like reference numerals and a description of the interconnection in operation will be omitted. In FIG. 5, the gate structure, as illustrated with respect to the channel region 20a, has channels Ch1 and Ch2 with a width limited by a gate groove 32 which is formed in the surface of the substrate. More specifically, in the embodiment of FIG. 1, the P+-type region 22a defines the gate P-N junction with the N-type region 20a and determines the channel width whereas in the embodiment of FIG. 5, the gate groove 32 is provided instead of the P-type region 22a and an appropriate insulating film 34 is formed in a manner to cover the inner surface of the groove. In this case, the gate electrode is connected to P-type layer 16a and 16b and controls the spreading of depletion layers of the P-N junctions between these P-type layers 16a and 16b and the N-type region 20a and controls the carrier currents in the channels Ch1 and Ch2.

It should be understood from the previous description that the invention can be embodied in a variety of modified or altered aspects without being restricted to the above described embodiments, by way of example, although the two channels Ch1 and Ch2 are provided adjacent to one gate element in the embodiment of FIG. 1 or FIG. 5, the number need not always be two but may be one. In addition, the semi-conductor layers 18a, 18b, 18c, 14 etc., can be substituted by polycrystalline silicon of high impurity concentration. Furthermore, in the embodiment of FIG. 5, a gate electrode which is made of metal or low resistivity polycrystalline silicon may be disposed in the groove 32 so as to control the carrier currents in the channels Ch1 and Ch2 by both the insulated gate and the junction gate.

Referring to FIGS. 6a through 6d, shown therein are the manufacturing steps for a horizontal type junction FET in accordance with the teachings of the present invention. In the first step as shown in 6a there is prepared a semi-conductor substrate 40 which is made of, for example, silicon and which includes a P-type semi-conductor layer 41 and a N-type semi-conductor layer 42 arranged thereon in a stacked manner. Although the substrate 40 can be formed by epitaxially growing the N-type layer 42 on the P-type silicon layer 41, it can be readily obtained by diffusing an appropriate donor impurity into the surface of the P-type silicon layer 41. The N-type semi-conductor layer 42 is to become the sources and the drains and has a proper impurity concentration therefor. Subsequently, the surface of the N-type layer 42 is thermally oxidized to form a silicon oxide layer 44. Furthermore, a silicon nitride ($Si_3N_4$) layer 46 is deposited thereon by a chemical vapor deposition (CVD) process. The silicon nitride layer 46 and the underlying silicon oxide layer 44 are subjected to selective etching to provide openings in a shape conforming to a channel forming pattern. In the openings is deposited phosphorus to form phosphorus layers 48A, 50A and 52A which are slightly diffused into the layers 42 thereunder. Thereafter, phosphorus silicate glass layers within the respective openings are etched and removed. Furthermore, the silicon nitride layer 46 and the silicon oxide layer 44 are provided with openings in conformity with a gate forming pattern and boron is deposited through the respective openings to form high concentration boron layers 54A and 54Aa through 54Ac which are slightly diffused into the layers thereunder so as to be shallower than that of the phosphorus. The channel forming pattern is, for example, in the shape of stripes while the gate forming pattern may assume the shape of closed loops which have stripe portions 54Aa, 54Ab and 54Ac overlapping the central portions of the respective striped diffusion layers 48A, 50A and 52A. The diffused layers 48A and 54Aa, 50A and 54Ab and 52A and 54Ac, are formed by doping with impurities through the same openings respectively.

Figure 6A:
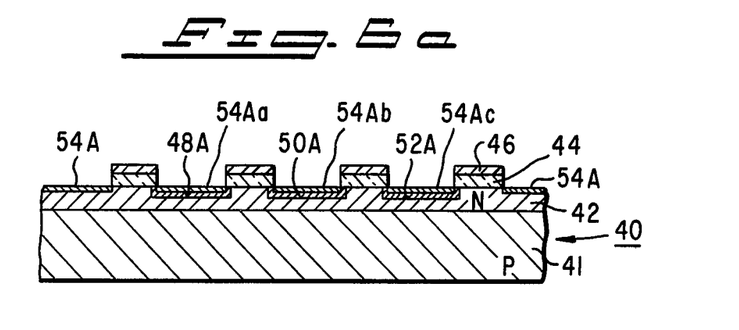
FIGS. 6a to 6d are sectional views illustrating another embodiment of a method of manufacturing a horizontal type junction FET in accordance with the teachings of the present invention.
Figure 6B:
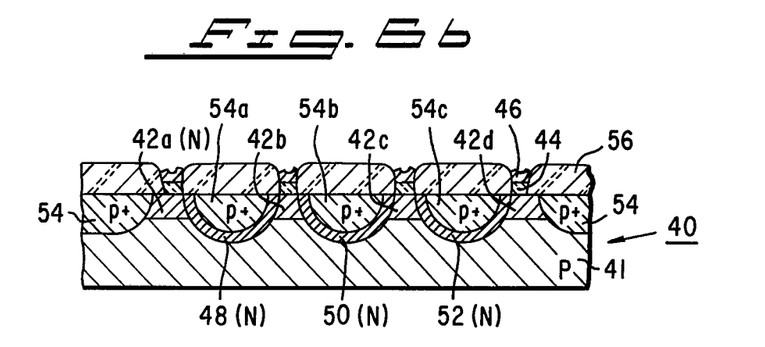

In the next step, as shown in FIG. 6b, the substrate 40 is again put in a diffusion furnace and subjected to drive-in diffusion so that the phosphorus and boron which are respectively contained in the phosphorus diffused layers 48A, 50A and 52A and the high concentration boron diffused layers 54A and 54Aa through 54Ac are simultaneously diffused and redistributed to be deeper than the N-type layer 42. In this way, there are formed striped N-type channel regions 48, 50 and 52, a P+-type gate region 54 in the shape of a closed loop and striped P+-type gate regions 54a, 54b and 54c which are continuous to the gate region 54 and which lap over the N-type regions 48, 50 and 52 respectively and shallower than the former. Simultaneously, striped N-type source regions 42a and 42c as well as drain regions 42b and 42d are formed as a result of the division of the N-type layer 42 by the previously described diffused regions. Each of the channel regions 48, 50 and 52 defines one P-N junction between it and the P-type layer 41 and defines the other P-N junction between it and the corresponding one of the P+-type regions 54a, 54b and 54c. The distance between both of the P-N junctions, that is the channel thickness or width is precisely set as the difference of the diffused depths. By the drive-in diffusions described above, a comparatively thick silicon oxide layer 56 is thermally created on the surface of the substrate.

Figure 6C:
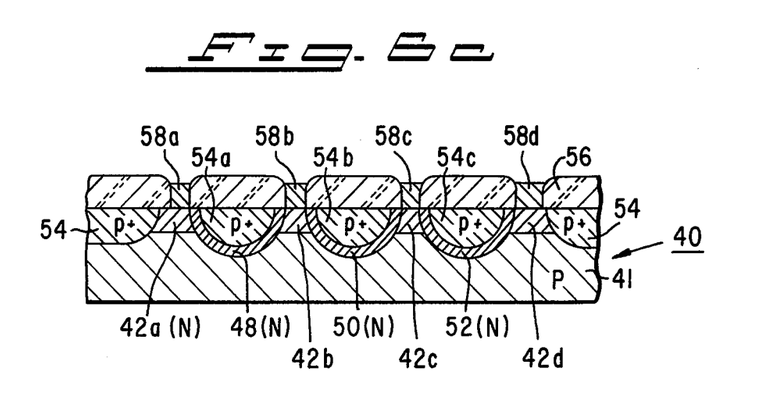

In the next step, as shown in FIG. 6c the silicon nitride layer 46 and the silicon oxide layer 44 are fully removed and polycrystalline silicon is deposited by a CVD process. In addition, simultaneously therewith or thereafter, the deposited polycrystalline silicon layer is doped with phosphorus at high concentration to form low resistivity polycrystalline silicon layers 58a, 58b, 58c and 58d for ohmic contact.

Figure 6D:
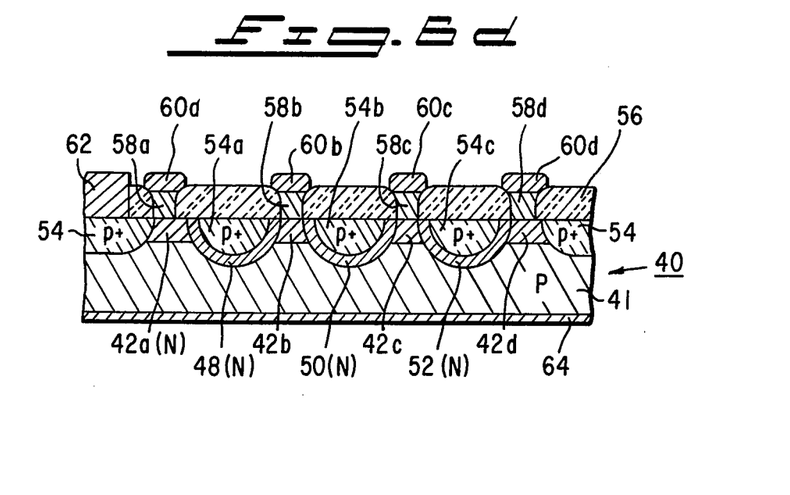

Lastly, as shown in FIG. 6d, metal electrode layers 60a through 60d are brought into ohmic contact with the respective polycrystalline silicon layers 58a through 58d by any conventional method and a gate electrode layer 62 and a substrate electrode layer 64 are respectively formed on the P+-type region for gate 54 and on the rear surface of the P-type layer 41. The source electrodes 60a and 60c and the drain electrodes 60b and 60d are respectively interconnected.

In the above manufacturing process, there has been described a method of diffusing and redistributing the boron and phosphorus at the same time. It is also within the scope of the present invention, to previously form the channel regions 48, 50 and 52 by the diffusion of phosphorus and thereafter form the gate regions 54a, 54b and 54c by the diffusion of boron.

Figure 7:
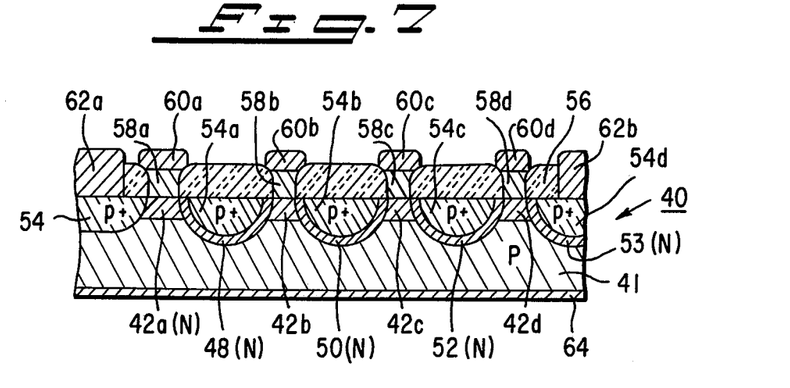
FIG. 7 is a sectional view illustrating another embodiment of a dual-gate horizontal type junction FET in accordance with the teachings of the present invention.

Furthermore, as shown in FIG. 7, a gate electrode layer 62b conductively connected to gate regions 54a through 54d may be provided separately from a substrate gate (back gate) electrode layer 62A. To this end, a N-type isolating layer 53 may be formed by diffusion treatment simultaneously with the formation of the channel regions 48, 50 and 52 and the gate region 54d may be formed by a diffusion treatment simultaneously with the formation of the other regions 54a through 54c in a manner to be electrically separated from the N-type drain region 42d as well as the P-type layer 41 by the N-type layer 53.

Figure 8:
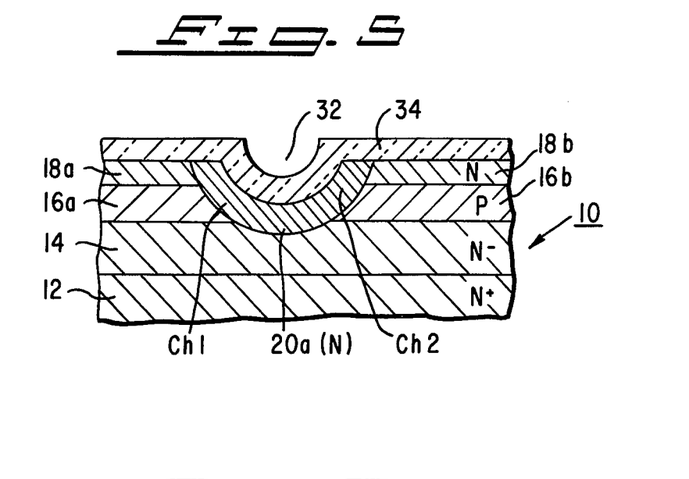
FIG. 8 is a sectional view of another embodiment illustrating a vertical type junction FET made in accordance with the teachings of the present invention.

Referring to FIG. 8 shown therein is another vertical type junction FET in accordance with the teachings of the present invention. The FET is manufactured by the method as described hereinbelow. First, a semiconductor substrate 70 made of, for example, silicon is prepared which has, in an order from the lower most layer, a N+-type layer 72, a N−-type layer 74, a P-type layer to become P-type gate region 76a through 76d and an N-type layer to become N-type source region 78a through 78d. The substrate 70 is prepared in such a way that the P-type layer to become the P-type regions 76a through 76d is epitaxially grown on one principle surface of the N−-type silicon layer 74. The substrate 70 is further prepared such that the N+-type layer 72 is formed by diffusing a donor impurity simultaneously into an upper surface layer of the P-type layer and the other principle surface of the N-type layer 74. The N-type layers 72 and 74 are to function as a drain region and their impurity concentrations and other parameters are determined so as to fulfill this purpose.

Subsequently, by diffusion steps similar to those described in detail with reference to FIG. 6a and 6b, N-type channel regions 80, 82 and 84 reaching the N−-type drain layer 74 and a p+-type gate region 86 as well as its parts 86a through 86c being shallower than the channel regions are formed. Simultaneously the P-type gate region 76a through 76d and the N-type source regions 78a through 78d are formed. The channel regions 80, 82 and 84 and the gate regions 86a, 86b and 86c shallowly formed within the respective former regions may be formed in a striped plan pattern as described in the previous embodiments. Alternately, the source region 78a through 78d may be formed in a mesh pattern as a whole and the above sited channel and gate regions may be arranged as circular or square patterns at portions corresponding to meshes of the mesh pattern. In any event, the respective N-type channel regions 80, 82 and 84 form P-N junctions between them and the P-type gate regions on their both sides 76a and 76b, 76b and 76c and 76c and 76d. Also formed are P-N junctions between them and the P+-type gate regions 86a, 86b and 86c. In this instance, the substantial thickness or width of each N-type channel region is, when exemplified as to the region 80, determined by the distance between the P+-type region 86a and the P-type region 76a or 76b. In other words, the thickness or width of each end type channel region is precisely determined as the difference between the diffusion depths of the two diffused regions 80 and 86a. The length of each channel region is substantially set by the thickness of the P-type layer 76a through 76d and can be made very small. Furthermore, the channel regions are adapted to lie by the side of the respective P+-type gate regions 86a, 86b and 86c which is equivalent to the integration of a large number of channels within a single chip and sharply increases the current capacity per chip. That is to say, the chip area may be smaller than in the prior art in order to obtain a device of the same current capacity. In addition, since the P+-type gate regions 86 and 86a through 86c are formed to have high impurity concentration, the gate series resistance is reduced.

Thereafter, in the same manner as described with reference to FIGS. 6c and 6d, polycrystalline silicon layers for ohmic contacts 88a through 88d are caused to touch the corresponding source regions 78a through 78d respectively. A source electrode layer 90 made of a metal is provided so as to short circuit these polycrystalline silicon layers 88a through 88d and a gate electrode layer 92 and a drain electrode layer 94 are formed. The N+-type layer 72 serves to secure good ohmic contact for the drain electrode layer 94. A silicon oxide layer 87 which corresponds to the previously described silicon oxide layer 56 is provided.

In the vertical type junction FET illustrated in FIG. 8, the gate electrode 92 is provided common for the P-type gate regions 76a through 76d and the P+-type gate regions 86a through 86c. It is also within the scope of the present invention, however, that the gate electrode for the former and the gate electrode for the latter be separately provided as shown in FIG. 7. In some cases the electrode 90 may be used as the drain electrode and the electrode 94 is the source electrode.

Figure 9A:
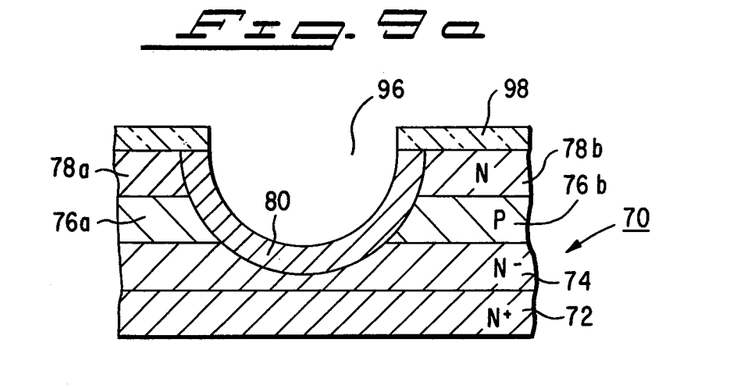
FIGS. 9a and 9b are sectional views illustrating a modified embodiment for a method of manufacturing a vertical type junction FET made in accordance with the teachings of the present invention.
Figure 9B:
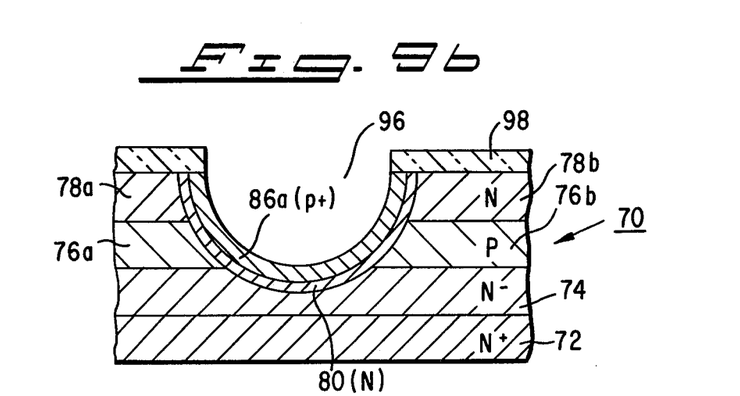

Referring to FIGS. 9a and 9b, shown therein is a modified embodiment of a manufacturing method for a FET in accordance with the teachings of the present invention. While the manufacturing steps of this embodiment are similarly applicable to both the horizontal type junction FET shown in FIGS. 6a through 6d and the vertical type junctions FET shown in FIG. 8, it will be explained as being applied to vertical type junction FET for the sake of convenience. In FIG. 9 those elements which are the same as in FIG. 8 are given like reference numerals and a description of their inter-connection in operation will be omitted.

Referring to FIG. 9a, the portion where the N-type region 80 is to be formed a recess 96 is provided according to a channel forming pattern. Thereafter, a donor impurity is diffused from an opening in a mask 98 into a selected area, to form a N-type channel region 80. Subsequently, as shown in FIG. 9b, an acceptor impurity is diffused into the recess 96 through the identical opening in the mask 98 thinly and at high concentration to form a P+-type gate region 86a. The N-type channel region 80 forms P-N junctions between it and the P-type regions 76a and 76b, respectively, and also forms a P-N junction between it and the P+-type region 86a. The recess 96 in FIG. 9a may well be formed by diffusing and forming the N-type channel 80 and thereafter hollowing out a surface layer of the region 80. In addition, the recess may be U shaped or V shaped in section.

With the manufacturing steps illustrated in FIGS. 9a and 9b, it is possible to shorten the period of time required for the diffusion treatments or to dope a predetermined part of the N-type channel region 80 with acceptors at high concentration so as to form the low resistivity P+-type gate region 86a.

From the foregoing description, it is apparent that the principal functional effects which are brought forth by this invention are as follows:

1. The impurity concentration of the channel and that of the source or the drain can be determined independently of each other. It is therefore possible to lower the saturation or ON resistance and to simultaneously make the pinch-off voltage low or the drain break-down voltage high.

2. One time mask alignment suffices and the steps of manufacture are simple. This enables one to except a high yield, in combination with ease of control of channel width.

3. Especially in the situation of applying this invention to the manufacturing of vertical type junction FET, a minute gate structure can be utilized and a high frequency device of low gate capacitance can be fabricated. Besides a low-noise device having a high Gm (mutual conductance) can be readily fabricated by making the channel impurity concentration high.

In all cases, it is understood that the above described embodiments are merely illustrative of but a few of the many possible specific embodiments which can represent applications of the principles of the present invention. Numerous and varied other arrangements can be readily devised by those skilled in the art without departing from the spirit and scope of the invention.

We claim:

1. A method of manufacturing a junction field effect transistor comprising the steps of:
preparing a semiconductor substrate which has one principal surface and which includes a first semiconductor layer of one conductivity type extending substantially in parallel with said principal surface and a second semiconductor layer of an opposite conductivity type to said one conductivity type extending substantially in parallel with and on said first semiconductor layer, said second semiconductor layer for providing a source and a drain;
providing a selective mask layer which has an impurity transmitting portion corresponding to a predetermined channel forming pattern on said principal surface;
depositing on and slightly diffusing into said principal surface through said impurity transmitting portion a first impurity of said opposite conductivity type;
depositing and slightly diffusing into said principal surface through said impurity transmitting portion a second impurity of said one conductivity type, said second impurity type being diffused shallower than said first impurity type, said second impurity type for providing a gate; and
drive-in diffusing said first and second impurities into said substrate to such a depth that at least said first impurity reaches said first semiconductor layer, said second impurity diffusing to a depth shallower than said first impurity and said first impurity forming a channel.

2. A method of manufacturing a junction field effect transistor according to claim 1, wherein prior to the selective introduction of at least one of said said first and second impurities into said substrate, a recess of predetermined depth conforming to said channel forming pattern is formed.

3. A method according to claim 1 wherein said one conductivity type is a P-type and said opposite conductivity type is an N-type.

4. A method for manufacturing a junction field effect transistor comprising the steps of:
preparing a semiconductor substrate which has one principal surface and which includes a heavily doped first semiconductor layer of one conductivity type extending substantially in parallel with said principal surface, a lightly doped second semiconductor layer of one conductivity type provided on said first layer, a third semiconductor layer of an opposite conductivity type provided on said second layer, a fourth semiconductor layer of said one conductivity type provided on said third layer, said first and second layers for providing either one of a drain and a source and said fourth layer for providing the other one of a drain and a source;
providing a selective mask layer which has an impurity transmitting portion corresponding to a predetermined channel forming pattern on said principal surface;
depositing on and slightly diffusing into said principal surface through said impurity transmitting portion a first impurity of said one conductivity type;
depositing on and slightly diffusing into said principal surface through said impurity transmitting portion a second impurity of said opposite conductivity type, said second impurity being diffused shallower than said first impurity, said second impurity for providing a gate; and
drive-in diffusing said first and second impurities into said substrate to such a depth that at least said first impurity reaches said second semiconductor layer, said second impurity diffusing to a depth shallower than said first impurity and said first impurity forming a channel.

5. A method of manufacturing a junction field effect transistor according to claim 4, wherein prior to the selective introduction of at least one of said first and second impurities into said substrate, a recess of predetermined depth conforming to said channel forming pattern is formed.

* * * * *